Oct. 1, 1957 F. SKWAREK 2,808,506

TRACKING MECHANISM FOR GANGED RADIO CIRCUITS

Filed March 24, 1953

INVENTOR.

Frank Skwarek

BY Darby & Darby

ATTORNEYS

United States Patent Office 2,808,506

Patented Oct. 1, 1957

2,808,506

TRACKING MECHANISM FOR GANGED RADIO CIRCUITS

Frank Skwarek, Westbury, N. Y., assignor to Polarad Electronics Corporation, Brooklyn, N. Y., a corporation of New York Application March 24, 1953, Serial No. 344,420

11 Claims. (Cl. 250—20)

Figures 1, 2:
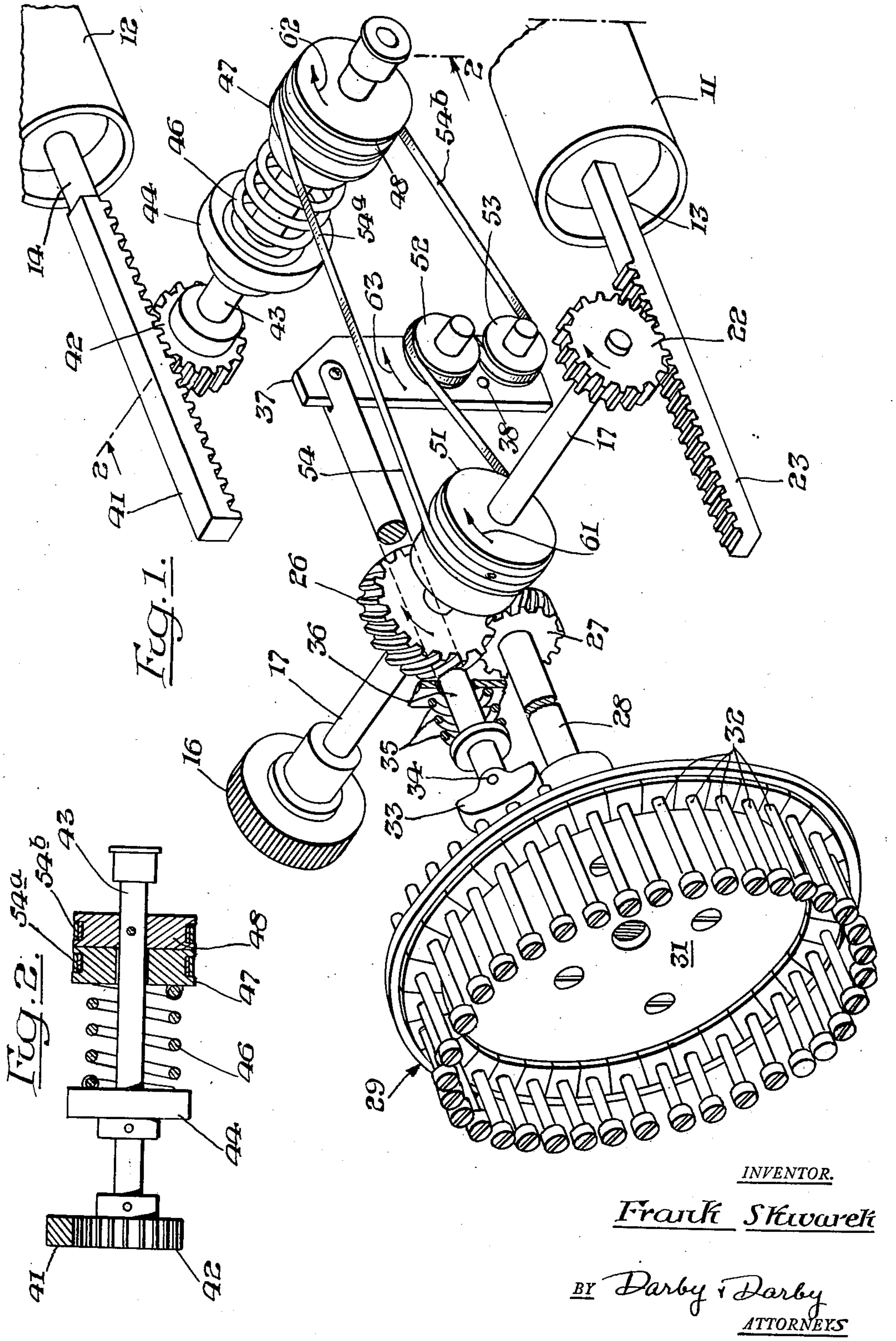

The present invention relates to improvements in radio receivers, and particularly to improvements in tracking mechanisms for such receivers.

Many radio receivers include a plurality of separate tunable circuits, and it often becomes important to be able to tune these various circuits simultaneously while maintaining them in predetermined relationship. For example, in a tuned radio frequency type of receiver, various tuned circuits must be maintained with equal resonant frequencies. In stagger-tuned circuits, such tuned circuits must be maintained with a constant difference between their resonant frequencies. Also, in the superheterodyne type of receiver, an oscillator tuned circuit and a radio frequency tuned circuit must be made tunable over the entire range of reception for the receiver, while maintaining a constant frequency difference between the resonant frequencies of the respective tuned circuits.

In many situations the tuning of a tuned circuit is accomplished by the translation or the rotation of a movable portion of a variable impedance or reactance element. Such elements may be, for example, variable condensers, variable inductors such as variometers or permeability-tuned coils, or may be tuned transmission line sections or cavity resonators having movable plungers or wall sections. In many of these types of variable element, the variation of resonant frequency as a function of displacement of the control member, such as the tuning shaft or rod, is not a linear relationship, and these relationships may differ for the respective tuned circuits to be simultaneously controlled. This gives rise to a problem known as tracking, by which is meant the maintenance of the respective tuned circuits in their proper relationship with respect to their tuned frequencies over the entire range of variation in tuning. This problem is particularly important with respect to cavity resonators where two resonators tuned to different frequencies required different movements of their controlling members for the same frequency change, and this relationship is a complexly variable one over the range of frequencies used.

The present invention provides an improved mechanism for the conjoint operation of two or more frequency-determining members, while maintaining any desired relationship between the frequencies produced thereby. It particularly permits duplicating any desired relationship among the displacements of the various frequency-determining members, by a relatively simple series of adjustments. The present invention is particularly useful in correcting the tracking of such circuits mass produced in quantity, where unavoidable variations in characteristics may be found, which can be readily compensated for by the present invention.

The present invention also provides a means for greatly improving the accuracy of tracking by minimizing any possible inaccuracies in making settings for proper tracking. For this purpose a direct coupling is provided between a tuning control member and one of the tuned circuits whose frequency-determining member may then be adjusted in linear proportion to the adjustment of the tuning member. A second frequency-determining member of another tuned circuit is also coupled to the tuning control member so as to be directly actuated thereby in linear relationship; however, in addition, the second frequency-determining member is actuated by a compensating or correcting mechanism which modifies the effect of the tuning control member upon the frequency-determining member. This modification is completely adjustable so that any desired characteristic of tracking can be properly matched by this apparatus. Furthermore, since the adjustable modification provides merely the correction, it will be apparent that any tolerance in adjustment to a given percentage of possible error will produce a much smaller percentage of error in the frequency produced and in the tracking desired.

It will be understood that other objects and advantages of the present invention will become more fully apparent from consideration of the following description of a preferred embodiment thereof, taken in conjunction with the appended drawing which, in Figure 1 shows a schematic perspective view of a preferred form of the invention, and in Figure 2 shows an axial partially cross-sectional view of a portion of Figure 1.

Referring to the drawing, there are shown a pair of tuned circuits 11 and 12 each having a respective frequency-determining element 13 and 14. For example, one circuit such as 11 may be part of a preselector or radio frequency amplifier stage, and the other circuit 12 may be part of an oscillator stage, in a superheterodyne system. In the present instance, the tuned circuits 11 and 12 are illustrated as being of the cavity resonator type each having a movable plunger coupled to the respective elements 13 and 14 for determining the resonant frequencies of the respective cavities. However, it will be understood that this is illustrative only, and any other form of frequency-determining element and tuned circuit may be utilized, whether translationally or rotatably actuated.

The main tuning control member of the apparatus is illustrated by the knob 16 which is fixed to a tuning control shaft 17 to which is attached a pinion 22 engaging a rack 23 directly connected to the frequency-determining member 13 of tuned circuit 11. In this way rotation of the tuning control knob 16 directly and linearly adjusts the position of the frequency-determining member 13. If desired, reduction gearing may be interposed between knob 16 and gear 22 with a suitable speed reduction determined by the gear ratios in accordance with the desired sensitivity of adjustment of frequency-determining member 13.

Also fixed to the main tuning shaft 17 is a helical gear 26 engaging a similar helical gear 27 fixed to a cross shaft 28. It will be understood that gears 26, 27 may be bevel gears, if desired, or any other form of motion-transmitting mechanism. Secured to shaft 28 is an adjustable cam 29 having a base plate 31 in which are mounted a plurality of adjustable screws 32 extending completely around the periphery of the plate 31. These screws 32 project to the opposite side of the plate 31 and engage a follower shoe 33 pivoted at 34 to a push-rod 36. It will be understood that the push-rod 36 is provided with suitable supports or bearings restricting it to axial translational movement, and is normally resiliently urged leftward as by spring 35, so that shoe 33 keeps in contact with the adjustment screws 32. It will therefore be understood that the axial position of the rod 36 is determined by the setting of the particular adjustment screw or screws 32 of the adjustable cam 29 with which the follower shoe 33 may be in engagement, and, as base plate 31 rotates, bringing different adjustment screws 32 into engagement with follower shoe 33, the axial position of rod 36 may be adjusted. Rod 36 is pivotally secured to a rocker plate 37 which is pivoted at 38 to the frame of the mechanism (not shown) and accordingly push rod 36 rotates plate 37 in correspondence with its own axial displacement.

Fastened to the frequency-determining element 14 is a rack 41 engaging a pinion 42 secured to a shaft 43. Fastened to the shaft 43 to rotate with it is a collar 44 to which is secured one end of a helical spring 46 surrounding shaft 43. The other end of the spring 46 is secured to a pulley 47 which is freely rotatable upon the shaft 43. Also secured to the shaft 43 and rotatable with it is a second pulley 48. Each of the pulleys 47 and 48 carries a single annular groove around the periphery thereof, the diameters of these grooves being equal.

Also secured to the main shaft 17 is a further pulley 51 which has a helical groove formed in its periphery; preferably the groove diameters of all the pulleys 47, 48 and 51 are identical. Rocker plate 37 carries a pair of pivotally mounted idler pulleys 52 and 53. A continuous metallic flexible tape 54 is secured at one end to the floating pulley 47 about which it is partially wrapped and also extends around the helical pulley 51 to which it is also secured. It then passes around the idler pulleys 52 and 53 to the pulley 48 about which it is also partially wrapped and to which its other end is secured. This tape is formed in a single length having one end secured to the floating pulley 47, the other end to the pulley 48, and an intermediate point to the helical pulley 51. If desired two separate tapes may be used, one extending from floating pulley 47 to helical pulley 51, the other from helical pulley 51, over idler pulleys 52, 53, to pulley 48. Preferably tape 54 is wrapped about 1½ times about pulley 51, and is fastened to pulley 51 at the center of the wrap-around, when knob 16 is at the center of its range.

The operation of the device will now be described. It will be readily apparent that displacement of tuning control knob 16 will produce a directly linearly proportional displacement of frequency-determining member 13. Also, assuming rocker plate 37 to be in fixed position, such displacement of tuning knob 16 will produce an equal displacement of shaft 43 and hence the displacement of frequency-determining member 14 will be equal to that of 13, where racks 23, 41 are the same and where pinions 22, 42 are the same.

This will be apparent from the action of tape 54. Upon tuning knob 16 to rotate pulley 51 as shown by the arrow 61 thereon, tape portion 54*b* is pulled leftward which positively rotates pulley 48 as shown by its arrow 62, since tape 54 is inextensible. This directly rotates in the same sense shaft 43 fixed to pulley 48. Opposite rotation of knob 16 pulls tape portion 54*a* leftward, and positively rotates floating pulley 47, coupled to shaft 43 through spring 46 and collar 44. Spring 46 is preferably under an initial or bias torsion which normally keeps tape 54 taut. Rotation of floating pulley 47 increases the torsional force of spring 46, and rotates collar 44 and shaft 43 in the sense opposite to their previously described displacement. This is possible since tape portion 54*b* has now slacked off, permitting pulley 48 and shaft 43 to rotate in response to spring 46. Thus rotational displacement of knob 16 and pulley 51 cause equal and correspondingly sensed displacements of frequency-determining elements 13 and 14.

As indicated above, however, where tuned circuits 11 and 12 are not identical, such identical displacements of their frequency-determining members 13 and 14 are not desired. The operation of cam 29, push rod 36 and rocker plate 37 interpose compensating or corrective displacement of element 14, as set into the device, to produce the desired differences between the displacements of elements 13 and 14.

To understand this operation most readily, first consider the situation when tuning knob 16 is in a fixed position. An angular displacement of rocker plate 37 about its pivot 38 in the sense of its arrow 63, tends to wrap tape portion 54*b* about idler pulleys 52, 53. This requires tape portion 54*b* to be longer than before, and something must give to allow such longer length. Since knob 16 is assumed fixed, shaft 17 and pulley 51 rigidly coupled thereto are also fixed. The necessary increase in length of tape portion 54*b* must thue come from an unwinding of pulley 48. Hence pulley 48 turns in the direction of its arrow 62, and rotates shaft 43 correspondingly. This displacement also rotates collar 44; however, pulley 47 cannot rotate, since pulley 51 is stationary and tape 54*a* does not stretch. Spring 46 hence merely increases its torsional force, without impairing the action.

Upon displacement of rocker plate 37 in opposite sense, tape portion 54*b* slackens. The pre-set or bias torsional force of spring 46 then rotates collar 44, shaft 43 and pulley 48 until tape portion 54*b* is once more taut, thus producing an opposite displacement of shaft 43 and element 14.

In this way, the displacement of element 14 is controlled independently from two sources, shaft 17 and rocker plate 37, the ultimate displacement of element 14 being the resultant of the displacement of both shaft 17 and rocker plate 37. To produce the desired displacement differences for proper tracking, the actuation of rocker plate 37 is also controlled from knob 16 and shaft 17, through the cam 29 whose adjustment provides at each angular position of shaft 28 or shaft 17, the proper position of rocker plate 37 for tracking compensation.

In setting up the apparatus initially, at each position of tuning knob 16, the adjustment screw or screws 32 in contact with follower shoe 33 are adjusted until tuned circuit 12 is in proper relation to tuned circuit 11, as determined by optimal operation of the system in which these circuits are coupled. Once all screws 32 are adjusted, the apparatus reproduces this proper relationship at all positions of knob 16, as desired for proper operation of the system.

An important and useful feature of the present invention resides in the provision of means whereby cam 29 determines only the necessary difference between the positions of elements 13 and 14. Thus, elements 13 and 14 may have a complete range of movement of the order of 6 inches, while the tracking compensation may be less ¼ inch. By the present invention, screws 32 may thus be relatively short, maintaining their accuracy and ease of adjustment. Furthermore, an error of adjustment of say 2% in the setting of a screw 32 will thus produce only an error of approximately $\frac{1}{25}$ as much, or .08%, in the setting of element 14, thus greatly increasing the accuracy of tracking compensation.

While the above detailed description covers a preferred embodiment of the invention, it will be understood that it is illustrative only. Wherever desirable or necessary, appropriate gearing or other speed reduction or step-up means may be interposed, as, for example, between knob 16 and shaft 17, between shaft 17 and rack 23, between shaft 43 and rack 41, between shaft 17 and shaft 28, etc. Also, pulley 51 need not be equal in diameter with respect to pulleys 47, 48, but by appropriate design may be of different diameter. Pinions 42 and 22 need not be equal, especially where the movements of elements 13 and 14 are widely different. Furthermore, shaft 28 need not be perpendicular to shaft 17, but may be parallel thereto or at any desired angle, being merely appropriately driven thereby. The tape 54 may be of any desired material, preferably unstretchable and flexible. It may be replaced by any similar device, such as a belt, chain, rope, etc. Also, the rocker plate 37 and its pulleys 52, 53 may be interposed in tape portion 54*a* where desired, with the same results. Furthermore, the pulley 51 need not be helical, but instead may have two separate circular grooves about which the ends of now independent tape portions 54*a* and 54*b* may be wrapped and to which these tape portions may be suitably fixed, and where desirable the pulleys can be eliminated and the tape wrapped about the shafts themselves.

The present apparatus can also be used for actuating any two controlled elements in response to a single controlling member, with any desired respective relationships to each other.

Accordingly it will be understood that many equivalent elements or features may be substituted for those shown, without departing from the spirit of the present invention, whose scope is defined solely by the appended claims.

What is claimed is:

1. A superheterodyne radio receiver comprising a radio frequency amplifier stage tunable circuit with a frequency-determining element, an oscillator stage tunable circuit with a second frequency-determining element, a common tuning control member for said circuits, and a tracking compensation mechanism interconnecting said common control member and said two frequency-determining elements, said mechanism comprising a connection between said control member and one of said frequency-determining elements for linearly proportionally driving said one frequency-determining element from said control member, a shaft coupled to the other of said frequency-determining elements, a first pulley fixed to said shaft, a second pulley floatingly mounted on said shaft, a collar fixed to said shaft, a helical spring fixed at one end to said collar and at the other to said floating pulley and surrounding said shaft, a helically grooved pulley coupled to said common control member, a pivotally mounted rocker plate, a pair of idler pulleys mounted on said rocker plate symmetrically about the pivot thereof, an elongated, non-stretchable flexible element wrapped about said first pulley and extending therefrom about said idler pulleys, said helical pulley and said second pulley, said latter element being fixed at one end to said first pulley, at the other end to said second pulley, and at an intermediate point to said helical pulley, said helical spring having a normal tension for keeping said elongated flexible element taut, a push rod pivotally coupled to said rocker plate at one end and having a cam follower shoe at the other end, an adjustable cam having a base plate and a plurality of adjustable screws extending therethrough and arranged in a circular array, said shoe being in alignment with at least one of said screws and in sliding contact therewith, a coupling between said cam base plate and said common control member for rotating said base plate in synchronism with said control member to bring successive ones of said screws in contact with said follower shoe, whereby said one frequency-determining element is driven directly proportionally by said control member, and said other element is also driven directly proportionally by said member with its displacement modified by action of said cam and rocker plate for permitting accurate tracking.

2. A radio system comprising a pair of tunable circuits having respective frequency-determining elements, a common tuning control member for said circuits, and a tracking compensation mechanism interconnecting said common control member and said two frequency-determining elements, said mechanism comprising a direct coupling between said control member and one of said frequency-determining elements, a coupling between said control member and the other of said frequency-determining elements for actuating said other element proportionally to the actuation of said one element, and means for modifying the actuation of said other element to maintain tracking between said circuits, said means comprising a shaft coupled to the other of said frequency-determining elements, a first pulley fixed to said shaft, a second pulley floatingly mounted on said shaft, a spring fixed at one end to said shaft and at the other to said floating pulley, a helically grooved pulley coupled to said common control member, a pivotally mounted rocker plate, a pair of idler pulleys mounted on said rocker plate, an elongated, non-stretchable flexible element wrapped about said first pulley and extending therefrom about said idler pulleys, said helical pulley and said second pulley, said latter element being fixed at one end to said first pulley, at the other end to said second pulley, and at an intermediate point to said helical pulley, said spring having a normal tension for keeping said latter element taut, and means for pivoting said rocker plate in accordance with the desired modification of said other element actuation at each position of said common control member.

3. A radio system comprising a pair of tunable circuits having respective frequency-determining elements, a common tuning control member for said circuits, and a tracking compensation mechanism interconnecting said common control member and said two frequency-determining elements, said mechanism comprising a direct coupling between said control member and one of said frequency-determining elements, a coupling between said control member and the other of said frequency-determining elements for actuating said other element proportionally to the actuation of said one element, and means for modifying the actuation of said other element to maintain tracking between said circuits, said means comprising a shaft coupled to the other of said frequency-determining elements, a first pulley fixed to said shaft, a second pulley floatingly mounted on said shaft, means having lost motion and resiliently coupling said floating pulley to said shaft, a third pulley coupled to said common control member, an elongated flexible element passing around all said three pulleys and fixed to said first, second and third pulleys, and means for adjusting the length of said flexible element at each position of said common control member to modify the position of said shaft in accordance with a desired modification of said other element actuation, whereby said one frequency-determining element is driven directly proportionally by said control member, and said other element is also driven directly proportionally by said member with its displacement modified by said adjusting means for permitting accurate tracking.

4. A tracking compensation mechanism for a radio system having a pair of tunable circuits having respective frequency-determining elements and a common tuning control member for simultaneously actuating said elements to maintain said circuits in predetermined frequency relationship over their entire tuning range, said mechanism comprising a direct coupling between said control member and one of said frequency-determining elements, a coupling between said control member and the other of said frequency-determining elements for actuating said other element proportionally to the actuation of said one element, said latter coupling including a pulley directly coupled to said control member, a pair of further pulleys, a resilient coupling between said further pulleys, a pair of elongated flexible elements coupling said first pulley respectively to said further pulleys, a coupling between one of said further pulleys and said other frequency-determining element, and means for adjusting the length of one of said flexible elements between its intercoupled pulleys at each position of said common control member in accordance with a desired modification of the actuation of said other frequency-determining element at said control member position.

5. A tracking compensation mechanism for a radio system having a pair of tunable circuits having respective frequency-determining elements and a common tuning control member for simultaneously actuating said elements to maintain said circuits in predetermined frequency relationship over their entire tuning range, said mechanism comprising a direct coupling between said control member and one of said frequency-determining elements, a coupling between said control member and the other of said frequency-determining elements for actuating said other element proportionally to the actuation of said one element, said latter coupling including a driver element directly coupled to said control member, a pair of driven elements, a resilient coupling between said driven elements, a pair of elongated flexible elements coupling said driver element respectively to said driven elements, a coupling between one of said driven elements and said other frequency-determining elements, and means for adjusting the length of one of said flexible elements between its intercoupled driver and driven elements at each position of said common control member in accordance with a desired modification of the actuation of said other frequency-determining element at said control member position.

6. A tracking compensation mechanism for operating two controlled elements simultaneously in desired respectively different manners from a common control member, comprising a direct coupling between said control member and one of said controlled elements for displacing said one controlled element in direct proportion to each displacement of said control member, a coupling for displacing said other element in direct proportion to a displacement of said control member, said coupling including a driver member rotatable by said control member and a flexible element extending between said driver member and the other of said controlled elements, a resilient coupling between said other controlled element and said control member, and means responsive to actuation of said control member for varying the effective length of said flexible element between said control member and said other controlled element by an amount corresponding at each position of said control member to a desired variation from said latter direct proportion, to provide said respective different manners of operation, whereby the resultant displacement of said other controlled element differs from a direct proportional relation to the displacement of said control member by an amount providing the respective different manners of operation of said two controlled elements.

7. A tracking compensation mechanism for a radio system having a pair of tunable circuits having respective frequency-determining elements and a common tuning control member for simultaneously actuating said elements to maintain said circuits in predetermined frequency relationship over their entire tuning range, said mechanism comprising a direct coupling between said control member and one of said frequency-determining elements, a coupling between said control member and the other of said frequency-determining elements for actuating said other element proportionally to the actuation of said one element, said latter coupling including an elongated flexible coupling element, and means for modifying the actuation of said other frequency-determining element to maintain tracking between said circuits, said means comprising means responsive to attainment of each position of said control member for modifying the length of said flexible coupling element at each said common control member position in accordance with a desired modification of said other frequency-determining element actuation at said position.

8. A tracking compensation mechanism for a radio system having a pair of tunable circuits having respective frequency-determining elements and a common tuning control member for simultaneously actuating said elements to maintain said circuits in predetermined frequency relationship over their entire tuning range, said mechanism comprising a direct coupling between said control member and one of said frequency-determining elements for proportional actuation of said one element, a coupling between said control member and the other of said frequency-determining elements for actuating said other element proportionally to the actuation of said one element, and means responsive to attainment of each position of said control member for modifying the effective length of said latter coupling at each said control member position to provide a desired modification of said other frequency-determining element at said position.

9. A tracking compensation mechanism for operating two controlled elements simultaneously in desired respectively different manners from a common control member, comprising a direct coupling between said control member and one of said controlled elements for displacing said one controlled element in direct proportion to each displacement of said control member, a coupling including a flexible element between said control member and the other of said controlled elements for displacing said other element in direct proportion to a displacement of said control member, and means responsive to actuation of said control member for varying the effective length of said flexible element between said control member and the other of said controlled elements by an amount corresponding at each position of said control member to a desired variation from said latter direct proportion, to provide said respective different manners of operation, whereby the resultant displacement of said second element differs from a direct proportional relation to the displacement of said control member by an amount providing the respective different manners of operation of said two control members.

10. A mechanism as in claim 9 wherein said flexible element length-varying means comprises an adjustable cam driven by said control member and operative to adjust the length of said flexible element by said desired variation at each position of said control member.

11. A mechanism as in claim 9 wherein said flexible element length-varying means comprises a first pulley secured to said control member, a second pulley secured to said other controlled element, a flexible element secured to said first and second pulleys, and means for varying the effective length of said flexible element between said first and second pulleys, comprising a pivotable rocker arm with a pair of idler pulleys thereon, said flexible element passing over said idler pulleys in opposite directions, whereby upon rotation of said rocker arm the effective length of said flexible element between said latter pulleys may be adjusted.

References Cited in the file of this patent

UNITED STATES PATENTS

| | | |
|---|---|---|
| 1,801,043 | Harber et al. | Apr. 14, 1931 |
| 2,212,348 | Ludington | Aug. 20, 1940 |
| 2,505,572 | Overacker | Apr. 25, 1950 |
| 2,555,475 | Dewhurst | June 5, 1951 |
| 2,641,709 | Stover | June 9, 1953 |